United States Patent
Moulard

(10) Patent No.: US 9,831,851 B2
(45) Date of Patent: Nov. 28, 2017

(54) BAW COMPONENT, LAMINATION FOR A BAW COMPONENT, AND METHOD FOR MANUFACTURING A BAW COMPONENT

(71) Applicant: Snaptrack Inc., San Diego, CA (US)

(72) Inventor: Gilles Moulard, Munich (DE)

(73) Assignee: SnapTrack, Inc., San Diego, CA (US)

( * ) Notice: Subject to any disclaimer, the term of this patent is extended or adjusted under 35 U.S.C. 154(b) by 0 days.

(21) Appl. No.: 14/653,768

(22) PCT Filed: Dec. 21, 2012

(86) PCT No.: PCT/EP2012/076714
§ 371 (c)(1),
(2) Date: Jun. 18, 2015

(87) PCT Pub. No.: WO2014/094884
PCT Pub. Date: Jun. 26, 2014

(65) Prior Publication Data
US 2015/0333248 A1 Nov. 19, 2015

(51) Int. Cl.
*H03H 9/70* (2006.01)
*H03H 9/54* (2006.01)
(Continued)

(52) U.S. Cl.
CPC ........... *H03H 9/706* (2013.01); *H01L 41/083* (2013.01); *H01L 41/18* (2013.01); *H01L 41/27* (2013.01);
(Continued)

(58) Field of Classification Search
CPC ....... H01L 41/083; H01L 41/18; H01L 41/27; H01L 41/277; H03H 3/02; H03H 3/04; H03H 2003/0414; H03H 2003/0421; H03H 2003/0435; H03H 2003/0471; H03H 9/205; H03H 9/54; H03H 9/583; H03H 9/605;
(Continued)

(56) References Cited

U.S. PATENT DOCUMENTS 6,339,276 B1  1/2002  Barber et al.
6,437,667 B1  8/2002  Barber et al.
(Continued)

FOREIGN PATENT DOCUMENTS

CN  1599244 A    3/2005
CN  102075161 A  5/2011
(Continued)

OTHER PUBLICATIONS

English language machine translation of JP 2008-211392, dated Sep. 11, 2008, 6 pages.*
(Continued)

*Primary Examiner* — Barbara Summons
(74) *Attorney, Agent, or Firm* — Patterson & Sheridan, L.L.P

(57) ABSTRACT

A BAW component, a lamination for a BAW component, and a method for manufacturing a BAW component are provided. A lamination for a BAW component includes a first layer with a first piezoelectric material and a second layer with a second piezoelectric material that is different than the first piezoelectric material. The first and the second piezoelectric material can be Sc doped AlN and AlN, respectively.

14 Claims, 3 Drawing Sheets

(51) Int. Cl.

| | |
|---|---|
| *H03H 3/04* | (2006.01) |
| *H01L 41/083* | (2006.01) |
| *H03H 9/205* | (2006.01) |
| *H01L 41/18* | (2006.01) |
| *H01L 41/27* | (2013.01) |
| *H03H 9/58* | (2006.01) |
| *H03H 9/02* | (2006.01) |
| *H01P 5/12* | (2006.01) |
| *H01H 1/00* | (2006.01) |
| *H01H 57/00* | (2006.01) |
| *H03H 9/17* | (2006.01) |

(52) U.S. Cl.
CPC .......... *H03H 3/04* (2013.01); *H03H 9/02015* (2013.01); *H03H 9/205* (2013.01); *H03H 9/58* (2013.01); *H01H 1/0036* (2013.01); *H01H 57/00* (2013.01); *H01H 2057/006* (2013.01); *H01P 5/12* (2013.01); *H03H 9/171* (2013.01); *H03H 2003/0435* (2013.01); *H03H 2003/0471* (2013.01); *Y10T 29/43* (2015.01); *Y10T 29/49005* (2015.01)

(58) Field of Classification Search
CPC .... H03H 9/703; H03H 9/706; H03H 9/02015; H03H 9/58; H03H 9/582; Y10T 29/49005
USPC .......................... 333/133, 188, 189; 310/312
See application file for complete search history.

(56) References Cited

U.S. PATENT DOCUMENTS

| | | | | |
|---|---|---|---|---|
| 6,441,539 | B1* | 8/2002 | Kitamura | H03H 3/02 310/321 |
| 6,441,703 | B1 | 8/2002 | Panasik | |
| 6,483,229 | B2* | 11/2002 | Larson, III | H03H 3/04 310/348 |
| 6,927,651 | B2* | 8/2005 | Larson, III | H03H 3/04 310/366 |
| 7,259,498 | B2 | 8/2007 | Nakatsuka et al. | |
| 9,065,421 | B2* | 6/2015 | Feng | H03H 9/173 |
| 9,246,079 | B2* | 1/2016 | Umeda | H01L 41/18 |
| 2002/0121499 | A1 | 9/2002 | Bradley et al. | |
| 2003/0006862 | A1 | 1/2003 | Takeuchi et al. | |
| 2005/0012568 | A1 | 1/2005 | Aigner et al. | |
| 2005/0231072 | A1 | 10/2005 | Inoue et al. | |
| 2008/0296529 | A1 | 12/2008 | Akiyama et al. | |
| 2012/0074811 | A1* | 3/2012 | Pang | H03H 9/605 310/317 |
| 2012/0107557 | A1* | 5/2012 | Akiyama | C23C 14/0617 428/141 |
| 2013/0127300 | A1 | 5/2013 | Umeda et al. | |
| 2014/0354109 | A1* | 12/2014 | Grannen | H03H 9/02015 310/311 |
| 2015/0333249 | A1* | 11/2015 | Moulard | H03H 3/02 310/367 |

FOREIGN PATENT DOCUMENTS

| | | | |
|---|---|---|---|
| JP | 2003087085 A | | 3/2003 |
| JP | 2008-211392 | * | 9/2008 |
| JP | 2009010926 | | 1/2009 |
| JP | 2009089006 A | | 4/2009 |
| JP | 2013128267 A | | 6/2013 |
| KR | 2003-0058061 | * | 7/2003 |

OTHER PUBLICATIONS

English language machine translation of KR 2003-0058061, dated Jul. 7, 2003, 9 pages.*
S. Tadigadapa et al., "Piezoelectric MEMS sensors: state-of-the-art and perspectives", Measurement Science and Technology vol. 20 (2009) 092001 (30pp), published Jul. 24, 2009 by IOP Publishing Ltd printed in the UK, pp. 1-30.*
Gu, H., et al., "Fabrication and Characteristic of Thin Film Bulk Acoustic Resonators with Highly c-Axis Oriented AlN Films," Chinese Physics Letter, vol. 23, No. 11, Jun. 19, 2006, pp. 3111-3114.
Moreira, M., et al., "Aluminum scandium nitride thin-film bulk acoustic resonators for wide band applications," Vacuum, vol. 86, Issue 1, Jul. 4, 2011, pp. 23-26.
International Search Report and Written Opinion—PCT/EP2012/076714—ISA/EPO—dated Oct. 15, 2013.

* cited by examiner

BAW COMPONENT, LAMINATION FOR A BAW COMPONENT, AND METHOD FOR MANUFACTURING A BAW COMPONENT

This patent application is a national phase filing under section 371 of PCT/EP2012/076714, filed Dec. 21, 2012, which is incorporated herein by reference in its entirety.

TECHNICAL FIELD

The present invention refers to BAW components, e.g., for use in RF filters for mobile communication devices, to laminations for BAW components, and to methods for manufacturing BAW components.

BACKGROUND

The present trend towards miniaturization of mobile communication devices demands for smaller electric and electro-acoustic components. BAW (BAW=bulk acoustic wave) components can be used in RF filters, e.g., in duplexers in front-end modules of mobile communication devices. A duplexer usually comprises a TX (transmission) and an RX (reception) filter. The TX filter and the RX filter are band pass filters with adjacent but different pass bands. An important factor determining the pass band of a BAW pass band filter is the thickness of piezoelectric material arranged between two electrode layers of a resonator of the filter and the mass loading of a resonator.

One type of conventional BAW duplexers has different piezoelectric material thicknesses for the TX filter and for the RX filter. Accordingly, the two filters are manufactured with different processes and on different carrier chips.

Another type of conventional BAW duplexers has additional mass, e. g. additional layers on the upper electrode, deposited on selected resonators to reduce their respective resonance frequency.

The method for manufacturing for both types are relative complex, expensive and susceptible to errors. In particular, conventional duplexers have TX and RX filters on different carrier chips what is contrary to the miniaturization efforts.

What is needed is a BAW component where two BAW layer stacks can be easily arranged on the same chip to obtain a miniaturized BAW filter and where the composition of the component allows improved manufacturing methods to increase the gain of good components. What is further needed is a lamination for a BAW component and a method for manufacturing such a BAW component.

SUMMARY

Embodiments of the present invention provide an improved BAW component, a lamination for a BAW component, and a method for manufacturing a BAW component.

A BAW component comprises a first BAW resonator with a bottom electrode, a top electrode, and a lamination between the bottom electrode and the top electrode. The lamination comprises a first layer with a first piezoelectric material and a second layer with a second piezoelectric material. The first piezoelectric material differs from the second piezoelectric material.

The two different materials of the lamination can have different physical and/or chemical properties. The first BAW resonator can be arranged on a carrier chip next to a second BAW resonator comprising the first piezoelectric material or the second piezoelectric material between a bottom electrode and a top electrode. The thickness of the piezoelectric material of the second BAW resonator can be equal to the thickness of the layer of the first BAW resonator with the same piezoelectric material. Then, the first BAW resonator has a different resonance frequency and can provide a different pass band due to the presence of the respective other piezoelectric material of the lamination not comprised in the second BAW resonator.

Such a BAW component can be manufactured with a high quality of the materials atomic structure as described below.

In one embodiment the first BAW resonator is arranged on a carrier chip next to a second BAW resonator comprising the first piezoelectric material a bottom electrode and a top electrode. The thicknesses of the layer with the first material in both resonators are equal.

In one embodiment, thus, the BAW component further comprises a carrier chip and a second BAW resonator. The first BAW resonator and the second BAW resonator are arranged on the same carrier chip.

In one embodiment thereof, the lamination of the first BAW resonator has a first thickness and the second BAW has a piezoelectric layer with a second thickness different from the first thickness.

The BAW resonator having the thicker piezoelectric layer can be utilized in a filter having the lower pass band and vice-versa. Thus, it is possible to utilize the first BAW resonator in a TX filter and the second BAW resonator in an RX filter.

In one embodiment, the first piezoelectric material and the second piezoelectric material have a different etching selectivity with respect to an etching agent.

This allows to deposit the piezoelectric material comprised by both resonators in the same manufacturing step and with the same layer thickness. The respective other piezoelectric material of the first BAW resonator can be deposited at the area of both BAW resonators. Then, the area of the first BAW resonator can be covered with a resist layer and an etching agent can etch the other piezoelectric material away from the area of the second resonator. The first piezoelectric material acts as an etch stop layer for the etching agent. After the etching process, the respective top electrodes can be arranged on the piezoelectric materials of both resonators.

In one embodiment, the etching agent is a wet etching agent.

In one embodiment, the etching agent is a metal iron-free developer that can also be used for photolithographic processes. It is possible that the etching agent comprises 2.36% Tetramethyl ammonium hydroxyl in combination with a wetting agent In one embodiment the etching agent is a dry etching agent.

In one embodiment, the first piezoelectric material is Sc (scandium) doped AlN (aluminum nitride), and the second piezoelectric material is AlN.

Thus, a lamination for a BAW component can have a first layer comprising Sc doped AlN and a second layer comprising AlN.

Other possible materials for the first piezoelectric material or for the second piezoelectric material are GaAs (gallium arsenide), ZnO (zinc oxide), PZT (lead zirconate titanate), KNN ($(K_{(1-x)}Na_x)NbO_3$) (with K: Kalium, Na: Sodium, Nb: Niobium, O: Oxygen).

The doping level of $Sc_xAl_{(1-y)}N$ can be approx. $1\% \leq x \leq 25\%$ with y mainly equal to x. Especially a level of approx. $5\% \leq x \leq 7\%$ is possible.

In one embodiment, the component is a duplexer and the first resonator is a resonator of the TX filter of the duplexer.

The BAW component can be a Bragg-Mirror based component or a FBAR component with a cavity under the lamination for confining acoustic energy.

Further variants, e.g., MEMS components comprising lever structures, are also possible. For instance, the component can comprise a piezo MEMS switch. A component with more than one switch is also possible. In an embodiment comprising two switches both switches can be made a single carrier chip. The first cantilever can have one piezoelectric layer while the second cantilever has two piezoelectric layers. Therefore, it is possible to process on the same chip two switches having two different closing voltages.

A method for manufacturing a BAW component comprises the steps:
providing a bottom electrode,
arranging a first piezoelectric material on or above the bottom electrode,
arranging a second piezoelectric material different from the first piezoelectric material on or above the first piezoelectric material,
arranging a top electrode on or above the second piezoelectric material.

It is possible that these steps establish a first BAW resonator. A second BAW resonator can be established next to the first BAW resonator where the two steps:
providing a bottom electrode;
arranging a first piezoelectric material on or above the bottom electrode; for establishing the first BAW resonator are also utilized to establish the second BAW resonator.

In order to arrange the second piezoelectric material on the first BAW resonator only, further photolithographic steps, e.g., via the use of a resist layer, can be applied.

In one embodiment, the method further comprises the step of selectively removing the second piezoelectric material at a previously specified area before arranging material of the top electrode on or above the first piezoelectric material in the specified area and on or above the second piezoelectric material in a further area located nearby the specified area.

The previously specified area is the area of the second resonator and the further area is the area of the first resonator.

Compared to other methods for manufacturing a BAW component and/or a BAW duplexer, the present method yields layer systems with a higher layer quality resulting in improved electro-acoustic properties as parameters, e.g., the electro-acoustic coupling coefficient $\kappa^2$, are enhanced.

Such a BAW component can be utilized to obtain a BAW resonator having a different resonance frequency than other resonators. Different resonance frequencies can be needed for TX and RX filters in duplexers. However, such differences in resonance frequencies can also be needed in ladder type filter structures where series resonators need to have a different frequency compared to parallel branch resonators. When the anti-resonance frequency of parallel resonators mainly match the resonance frequency of serial branch resonators in a ladder type structure, then a band pass filter is obtained. When the resonance frequency of parallel branch resonators matches the anti-resonance frequency of serial branch resonators, then a band stop filter of a notch filter can be obtained.

The two deposition steps relating to the first piezoelectric material and to the second piezoelectric material respectively can be done in situ or with a vacuum break. Even with a vacuum break during the different deposition steps good layer quality is obtained.

BRIEF DESCRIPTION OF THE DRAWINGS

Examples of BAW components, laminations and methods for manufacturing and the respective working principles are shown in the schematic figures.

DETAILED DESCRIPTION OF ILLUSTRATIVE EMBODIMENTS

Figure 1:
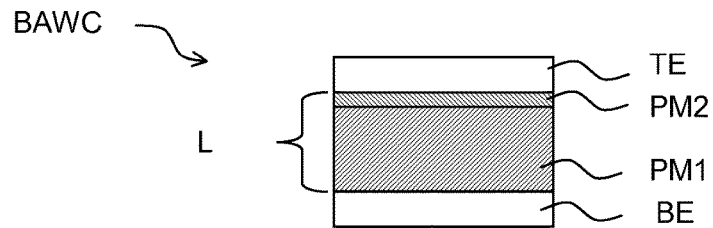
FIG. 1 shows a basic BAW resonator stack with a lamination L.

FIG. 1 shows a BAW component BAWC comprising a lamination L between a bottom electrode BE and a top electrode TE. The lamination comprises a first layer with a first piezoelectric material PM1 and a second layer with a second piezoelectric material PM2. The second piezoelectric material PM2 is arranged between the first piezoelectric material PM1 and the top electrode TE. The first piezoelectric material PM1 is different from the second piezoelectric material PM2. This allows high quality BAW components with more than one BAW resonators on a common carrier chip where different resonators have different resonance frequencies.

Figure 2:
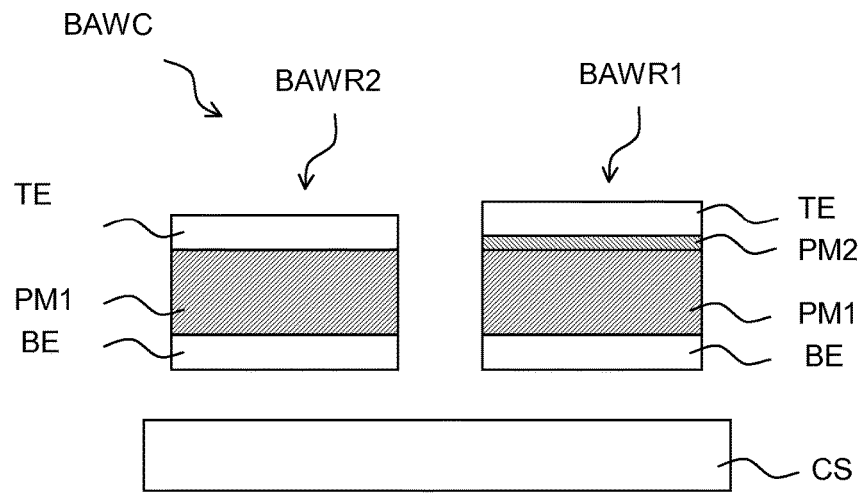
FIG. 2 shows a BAW component with two BAW resonator stacks.

FIG. 2 shows a BAW component BAWC where a first BAW resonator BAWR1 is arranged next to a second BAW resonator BAWR2. Both resonators can be arranged on or above a carrier substrate CS. Both resonators comprise a bottom electrode BE and a top electrode TE and the first piezoelectric material PM1. Only the first BAW resonator BAWR1 comprises a second piezoelectric material PM2. The piezoelectric material of the first BAW resonator BAWR1 is thicker than the piezoelectric material of the second resonator BAWR2. Thus, both resonators have different resonance frequencies although they can be manufactured with easy to perform manufacturing steps one next to the other on or above a common carrier substrate CS.

Figure 3:
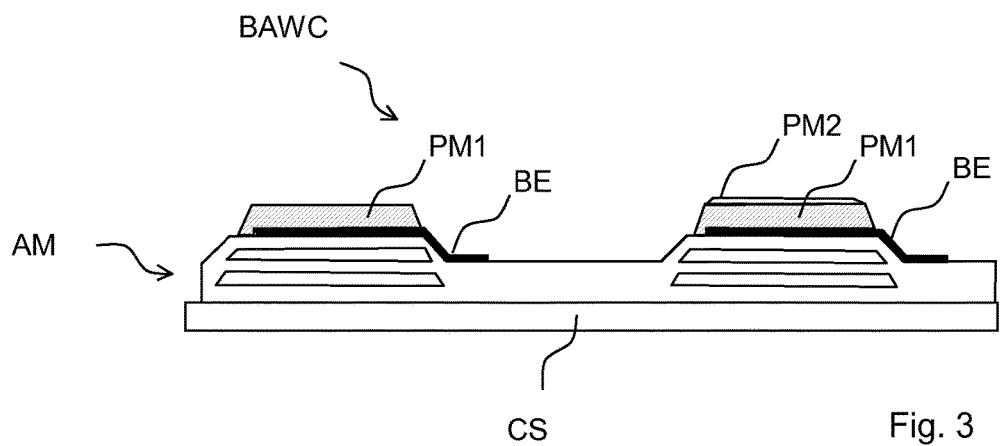
FIG. 3 shows elements of a BAW component comprising acoustic mirrors.

FIG. 3 shows main components of a BAW component BAWC where mainly the top electrode is omitted. Two resonator stacks are arranged on respective acoustic mirrors AM. The acoustic mirrors AM comprise a layer system with alternating high and low acoustic impedance. The acoustic mirror AM confines acoustic energy and allows to establish a resonance mode of the respective resonator.

Figure 4:
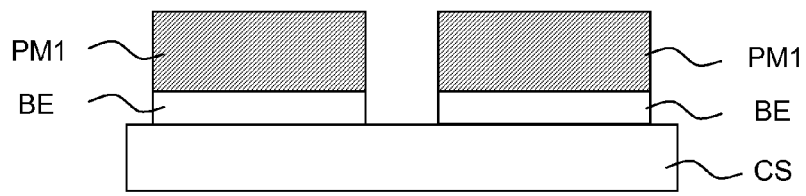
FIG. 4 shows a stage of a manufacturing process.

FIG. 4 shows a stage during one of several possible manufacturing processes where two resonator stacks are arranged next to another on a common carrier substrate CS. After depositing and structuring a bottom electrode BE, the first piezoelectric material PM1 is deposited and structured on the bottom electrode BE for both resonator stacks.

It may not be necessary to structure one or more layers.

Figure 5:
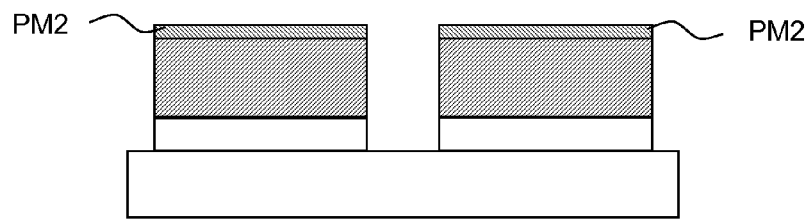
FIG. 5 shows a stage of a manufacturing process.

FIG. 5 shows a further stage of a manufacturing process where a second piezoelectric material PM2 is arranged on the first piezoelectric material. However, the second piezoelectric material PM2 is only needed in one of the resonator stacks and needs to be removed in the respective other resonator stack.

Figure 6:
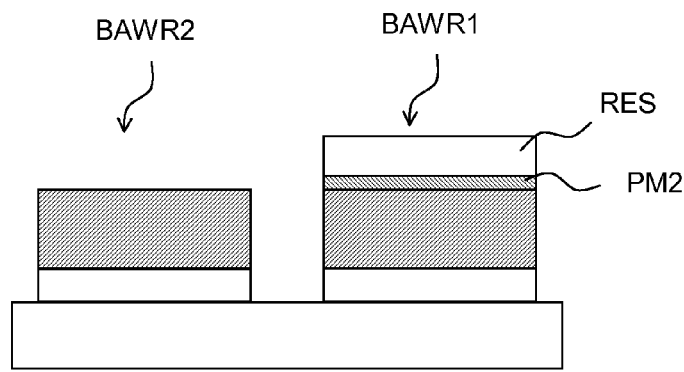
FIG. 6 shows a stage of a manufacturing process.

Accordingly, FIG. 6 shows a stage where a resist film RES is arranged on the lamination of the first resonator. The resist film RES protects the lamination of the later first resonator BAWR1 but the piezoelectric material PM2 is removed from the second resonator stack, the later second resonator BAWR2, shown on the left. Different properties of the different piezoelectric materials ensure that an etching agent etches the second piezoelectric material in such a way that the etching process stops when the second piezoelectric material PM2 is completely removed. The upper surface of the first piezoelectric material of the left resonator stack establishes an etch stop zone for the process.

Figure 7:
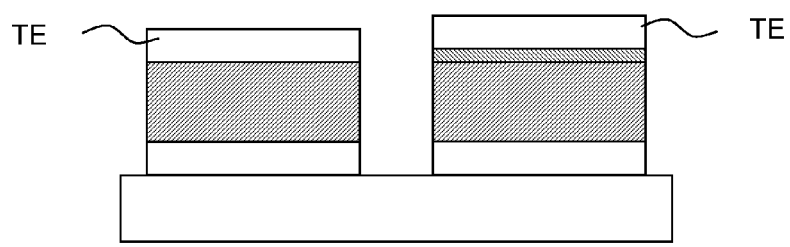
FIG. 7 shows a final stage of a manufacturing process.

FIG. 7 shows a final manufacturing stage where a top electrode TE has been deposited and structured on both resonator stacks.

Figure 8:
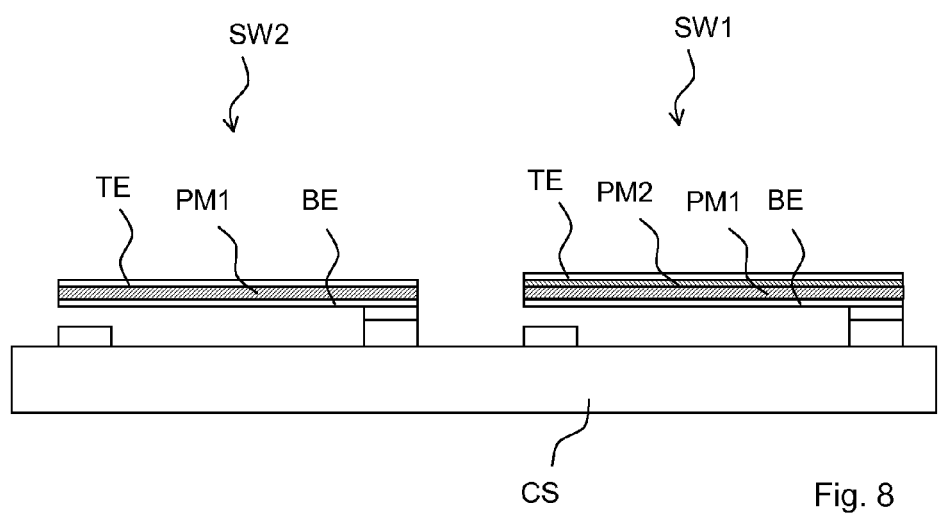
FIG. 8 shows a component with piezoelectric switches with different closing voltages.

FIG. 8 shows a BAW component where a lamination comprising a first piezoelectric material PM1 and a second piezoelectric material PM2 are arranged between a bottom electrode BE and a top electrode TE to establish a cantilever shaped switch SW1. The switch is arranged next to a switch SW2 without the second piezoelectric material PM2. The different constructions of the two switches allow different closing voltages.

Neither the BAW component nor the lamination for a BAW component nor the method for manufacturing a BAW component are limited to the embodiments described in the specification or shown in the figures. Components, laminations and methods comprising further materials or layers or components comprising further resonators or methods comprising further deposition steps or etching steps or combinations thereof are also comprised by the present invention.

The invention claimed is:

1. A BAW component, comprising:
a first bulk acoustic wave (BAW) resonator having a first bottom electrode, a first top electrode and a lamination between the first bottom electrode and the first top electrode, wherein:
the lamination comprises a first layer with a first piezoelectric material comprising Sc doped AlN and a second layer with a second piezoelectric material that is different from the first piezoelectric material and arranged over the first layer;
a carrier chip; and
a second BAW resonator consisting of a second bottom electrode, a second top electrode, and a piezoelectric layer between the second bottom electrode and the second top electrode, wherein:
the first BAW resonator and the second BAW resonator are arranged on the carrier chip; and
the piezoelectric layer is a layer of the first piezoelectric material, substantially free of the second piezoelectric material.

2. The BAW component of claim 1, wherein the lamination of the first BAW resonator has first thickness, and the piezoelectric layer of the second BAW resonator has a second thickness different from the first thickness.

3. The BAW component of claim 1, wherein the first piezoelectric material and the second piezoelectric material have a different etching selectivity with respect to an etching agent.

4. The BAW component of claim 3, wherein the etching agent is a wet etching agent.

5. The BAW component of claim 4, wherein the etching agent comprises 2.36% Tetramethyl ammonium hydroxyl in combination with a wetting agent.

6. The BAW component of claim 3, wherein the etching agent is a dry etching agent.

7. The BAW component of claim 1, wherein the second piezoelectric material is AlN.

8. The BAW component of claim 1, wherein the BAW component is a duplexer and the first BAW resonator is a resonator of a TX filter of the duplexer.

9. A method for manufacturing a BAW component, the method comprising:
providing a carrier chip;
providing a first bottom electrode on the carrier chip;
providing a second bottom electrode on the carrier chip;
arranging a first layer of a first piezoelectric material comprising Sc doped AlN over the first bottom electrode;
arranging a second layer of the first piezoelectric material over the second bottom electrode;
arranging a first layer of a second piezoelectric material, different from the first piezoelectric material, over the first layer of the first piezoelectric material;
arranging a second layer of the second piezoelectric material over the second layer of the first piezoelectric material;
selectively removing the second layer of the second piezoelectric material;
arranging, after the selectively removing the second layer of the second piezoelectric material, a first top electrode over the second layer of the first piezoelectric material; and
arranging a second top electrode over the first layer of the second piezoelectric material.

10. The method of claim 9, wherein the first piezoelectric material and the second piezoelectric material have a different etching selectivity with respect to an etching agent used during the selectively removing step.

11. The method of claim 10, wherein the etching agent is a wet etching agent.

12. The method of claim 11, wherein the etching agent comprises 2.36% Tetramethyl ammonium hydroxyl in combination with a wetting agent.

13. The method of claim 10, wherein the etching agent is a dry etching agent.

14. The method of claim 9, wherein the second piezoelectric material is AlN.

* * * * *